(12) United States Patent
Downey et al.

(10) Patent No.: US 6,295,625 B1
(45) Date of Patent: Sep. 25, 2001

(54) ERROR CORRECTING USING SIGNAL ANOMALY AS A HINT

(75) Inventors: Walter J. Downey, Los Gatos; Mark A. Stubbs, Felton; Philip H. Sutterlin, Saratoga; Luna Chen, Mountain View, all of CA (US)

(73) Assignee: Echelon Corporation, Sunnyvale, CA (US)

( * ) Notice: Subject to any disclaimer, the term of this patent is extended or adjusted under 35 U.S.C. 154(b) by 0 days.

(21) Appl. No.: 09/239,032

(22) Filed: Jan. 27, 1999

(51) Int. Cl.[7] .................................. H03M 13/45
(52) U.S. Cl. ............................... 714/780
(58) Field of Search .................................. 714/780

(56) References Cited

U.S. PATENT DOCUMENTS

| | | | |
|---|---|---|---|
| 4,763,331 | * 8/1988 | Matsumoto | 371/37 |
| 5,195,098 | 3/1993 | Johnson et al. | 371/37.2 |
| 5,461,629 | 10/1995 | Sutterlin et al. | 371/30 |
| 5,828,676 | * 10/1998 | Hurlbut et al. | 371/37.01 |

FOREIGN PATENT DOCUMENTS

| | | |
|---|---|---|
| SHO 62-48126 | 3/1987 | (JP) . |
| HEI 2-113341 | 4/1990 | (JP) . |

OTHER PUBLICATIONS

Chase, "A Class of Algorithms for Decoding Block Codes With Channel Measurement Information", IEEE Trans. on Information Theory, vol. IT–18, No. 1, Jan. 1972, pp. 170–182.*

Matsumoto, "Soft Decision Decoding Of Block Codes Using Received Signal Envelopes In Fading Channels", 1988 Intl. Communications Conf., pp. 756–761.*

Nordstrom, Alan W. and Robinson, John P., "An Optimum Nonlinear Code" *Inform. Contr.*, vol. 11, pp. 613–616, Nov./Dec. 1967.

* cited by examiner

Primary Examiner—Stephen M. Baker
(74) Attorney, Agent, or Firm—Blakely Sokoloff Taylor & Zafman LLP

(57) ABSTRACT

A "hint" signal is developed which points to suspected erroneous bits in received data by examining anomalies in the signal. More particularly, a delta phase pointer which quantifies one of the anomalies is used. The realigning of an IQ pointer provides an additional anomaly which is prioritized along with the delta phase pointer. The particular error correcting code used for the power line application provides seven check bits for a data byte and permits the correction of up to two errors. A third error is correctable through use of the hint signal and a parity bit.

10 Claims, 4 Drawing Sheets

ERROR CORRECTING USING SIGNAL ANOMALY AS A HINT

FIELD OF THE INVENTION

The invention relates to correcting of errors in data by using error correcting codes and signal anomalies pointing to suspected corrupted bits.

PRIOR ART

Error correcting codes (ECCs) have long been used to detect and correct errors in digital data. Additionally, it is known to examine a received signal for anomalies caused by noise or other conditions on the transmission media, and to correlate the anomalies with specific bits. For instance, a spike or phase shift may point to a potentially corrupted bit, and the state of that bit may be changed if parity is incorrect without the change. The use of this technology is described in the following U.S. Pat. Nos. 5,828.67; 5,461,629 and 5,195,098.

As will be seen the present invention extends the use of the hint signal in connection with an ECC.

SUMMARY OF THE INVENTION

An improvement in a method for correcting errors in a received signal where a hint based on signal anomalies is developed which points to a suspected error in the received signal is described. Signal anomalies are prioritized. The received signal is examined to determine the highest priority anomalies that are present and these are used to point to suspected errors.

In one embodiment, the two signal anomalies used are the delta phase pointer and the realigning of the IQ pointer.

DETAILED DESCRIPTION OF THE INVENTION

An apparatus and method for using anomalies in a received signal as hints for the correction of errors is described. In the following description specific details are set forth such as specific codes, in order to provide a thorough understanding of the present invention. It will be apparent to one skilled in the art, that the present invention may be practiced without these specific details. In other instances, well-known methods and circuits have not been set forth in detail in order not to obscure the present invention.

OVERVIEW OF THE PRESENT INVENTION

The present invention, in one embodiment, is used in connection with the transmission of data over power lines. In particular, the encoding and decoding of data, including the correcting of errors used in the present invention are embodied in a power line transceiver, other aspects of which are described in co-pending applications Ser. No. 09/183,565, entitled "TRANSMISSION AND DETECTION OF DATA IN A DUAL CHANNEL TRANSCEIVER" and Ser. No. 09/183,588 entitled "METHOD AND APPARATUS FOR DEFINING AND GENERATING LOCAL OSCILLATOR SIGNALS FOR DOWN CONVERTER," both of which have filing dates of Oct. 30, 1998 and are assigned to the assignee of the present invention. An error correcting code (ECC) as will be described below is transmitted with the bits forming code words (in one embodiment the code words are interleaved). The particular ECC described below corrects up to two errors in each byte of data. Other ECCs may be used including those which correct a greater number of errors. A hint signal is developed which allows the correction of a third code word bit. The hint signal relies on the examination of the received signal for anomalies in the signal which are used to develop pointers to potentially incorrect bits where the ECC cannot correct all the errors. The hint is used to verify that a bit, the state of which has been changed, was likely to have been erroneously detected. In particular, the signal anomalies are prioritized thus giving some anomalies more weight than others. More particularly one of the anomalies discussed below is a delta phase pointer which includes a quantified distance indicating the extent of the anomaly. Another signal anomaly is the realigning of the IQ pointer.

ERROR CORRECTING CODE (ECC) USED IN THE PRESENT INVENTION

Figure 1:
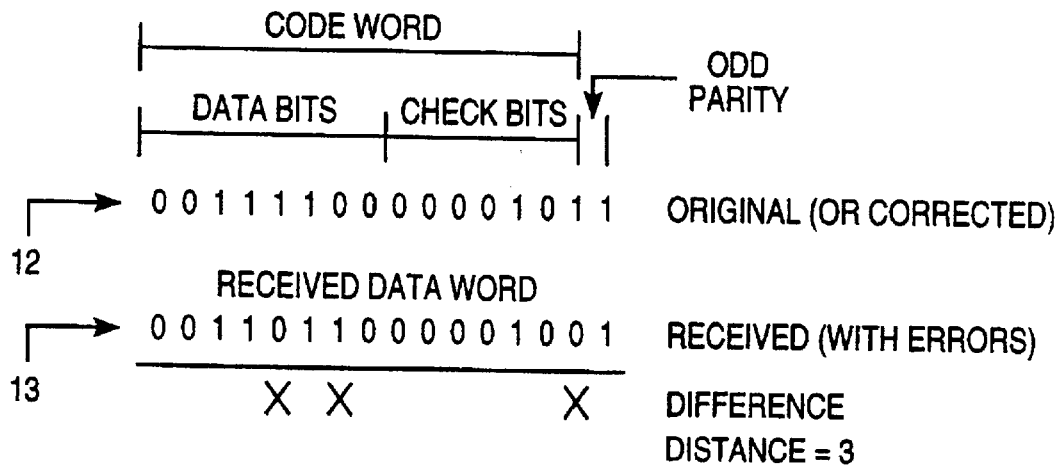
FIG. 1 illustrates an original code word and a received data word and the Hamming distance between the two.

While the present invention may be used with different ECCs, the one discussed below has been found to be particularly useful for power line applications. An understanding of this ECC is helpful in appreciating the prioritization used with the present invention. The ECC is described in "An Optimum Nonlinear Code," by Nordstrom & Robinson, *Inform. Contr*. Volume 11, pp. 613–616, November/December 1967. This nonlinear code has a length of 15 bits with a minimum Hamming distance of five between each of the possible 256 code words. Thus, for each byte of data, seven check bits are generated. In FIG. 1 an original data byte 00111100 of code word 12 is shown. Using the algorithm from the above referenced article, the seven check bits are generated, specifically 0000101. Additionally, with the present invention a parity bit is appended such that the parity over 16 bits is odd.

Assume for purposes of discussion that the original code word 12 of FIG. 1 (i.e., data bits and code bits) is transmitted along with the parity bit. Assume further that the received word 13 which includes errors from, for example, noise on a power line is detected. When comparing the received word with the original code word it can be seen that there are three bits that are different. For the described code the three differences are the Hamming distance. In practice the original data bits are not known at the receiver, and so the Hamming distance is computed by assuming 0, 1, 2 and 3 errors in the received data bits, generating the corresponding check bits and by checking the Hamming distance for all possible such errors.

Figure 2:
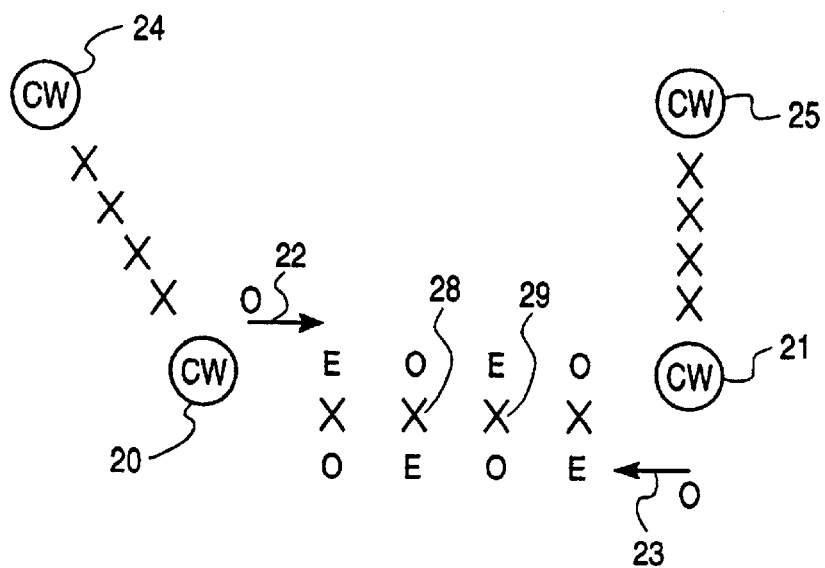
FIG. 2 is a diagram used to illustrate the ECC used in the present invention and also the added information provided by a parity bit.

Referring to FIG. 2 four code words 20, 21, 24 and 25 are illustrated. There is a Hamming distance of five between code words 20–21; 21–25; and 20–24. With the ECC described in the above-referenced article the maximum distance between any two code words is 15.

Assume that a word is received over a power line. The data bits of that word are first used to compute the check bits in accordance with the algorithm taught by the above-referenced article. Then, the computed check bits are compared with the received check bits. If the Hamming distance is zero, that is, if the computed check bits for the received data bits match the received check bits, it is assumed that the data bits have been correctly received. Even if the Hamming distance between the computed check bits and the received check bits is one or two, then the data bits are assumed to be correct (assuming for now the parity of the received data word is odd for the distance 2 case). If the Hamming distance is greater than two, then every possibility of one, two and three errors in the received data bits is tried, the corresponding check bits computed, and the Hamming distance determined between the received data word and a trial code word consisting of the corrected data bits and their corresponding computed check bits. If a Hamming distance of one or two is found, the data bits that produced that distance are assumed to be the correct data. If there are only one or two errors in the received code word there will be only one corrected data byte that provides a Hamming distance of one or two.

The parity bit used with the present invention provides additional information that is used to enhance the ECC. In the case of a Hamming distance of two, the parity bit should indicate that odd parity exists, assuming the parity bit is correct and there was an odd parity originally. For example, a distance of two from code word 20 in the direction 22 (marker 28) has odd parity. Similarly a distance of two from the code word 21 (marker 29) in direction 23 also has an odd parity. If the parity bit is even and appears to be correct, and the Hamming distance is two, the data is not accepted. Since the parity is not as it should be for two errors, then there must be something incorrect, for instance, there could be more errors than two.

SIGNAL ANOMALIES AND THEIR PRIORITIZATION

In the currently preferred embodiment of the present invention two signal anomalies are used and prioritized to provide a "hint" pointing to a bit which may have been improperly detected. These signal anomalies are the distance from an IQ phase pointer (this distance is sometimes referred to as the delta phase pointer or DPH) and the realigning or jumping of the IQ pointer. Other signal anomalies can be used such as spikes in the waveform or the presence of particular frequency components.

In U.S. Pat. No. 5,828,676 which is incorporated herein by reference, the developing of a hint which points to a hint "weak bit" based on an IQ pointer is discussed in detail. In general, this technique is used with angular modulation, that is where modulation is encoded onto a carrier signal by modulating the phase angle of the carrier signal. Binary phase-shift keying (BPSK) is a well-known example of angular modulation and is used in one embodiment of the present invention. A transmitter multiplies a +1 or −1 binary data signal and a sinusoidal carrier signal to create a BPSK signal that has two different phases that are 180° apart. A first phase represents a binary "0" and the second phase 180° apart from the first phase represents a binary "1."

A receiver demodulates an incoming BPSK data signal by multiplying an in-phase oscillator signal and a quadrature oscillator signal to generate an IX signal and a QX signal, respectively. Both the in-phase oscillator signal and the quadrature oscillator signal have the same nominal frequency as the carrier signal from the transmitter. However, the in-phase oscillator signal and quadrature oscillator signal are 90° apart in phase. Each of the two multiplied signals is passed through a low-pass filter to create an inphase data signal I and a quadrature data signal Q, respectively.

Figure 4A:
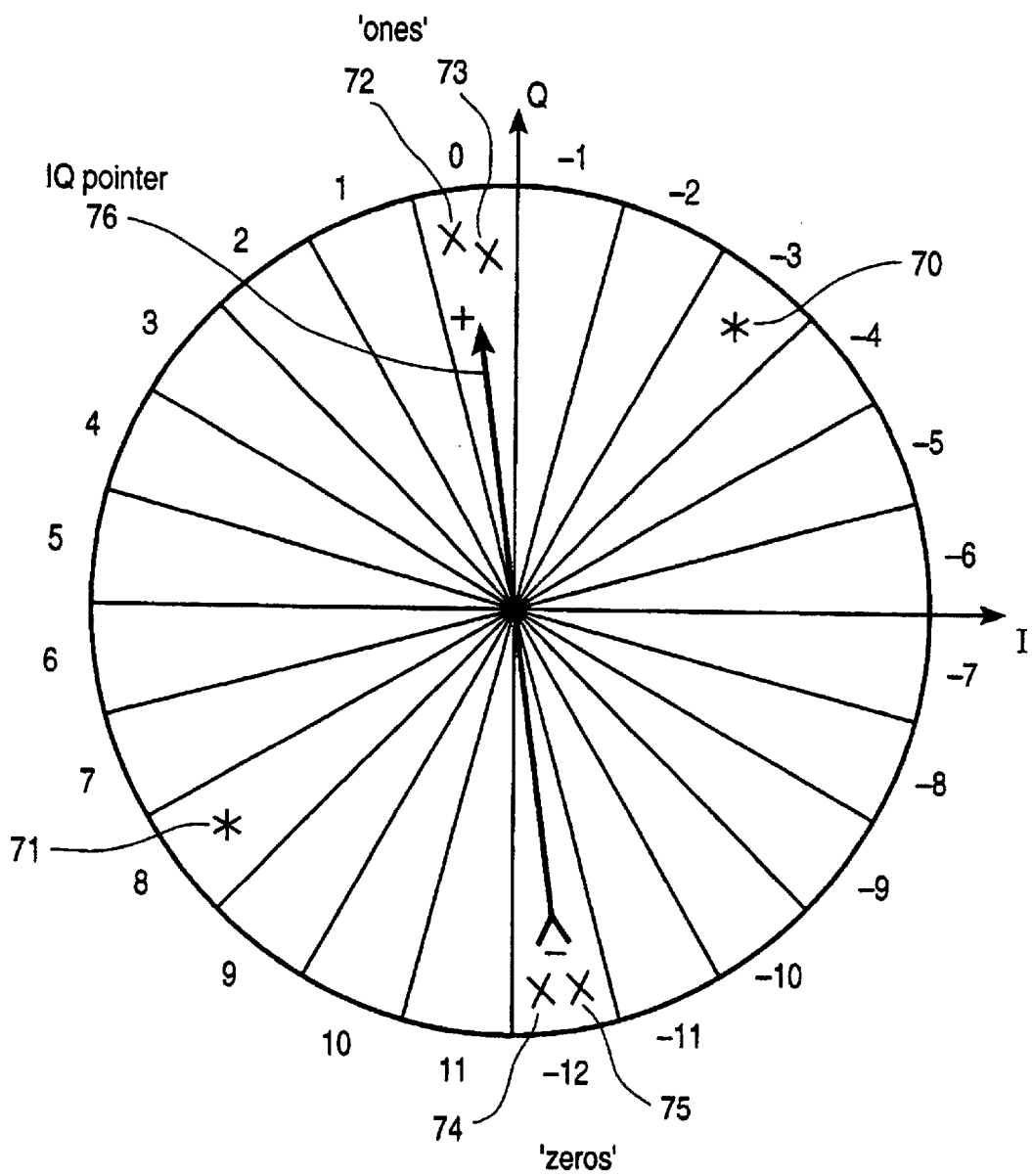
FIG. 4a is a diagram used to illustrate the delta phase distance and IQ pointer.
Figure 4B:
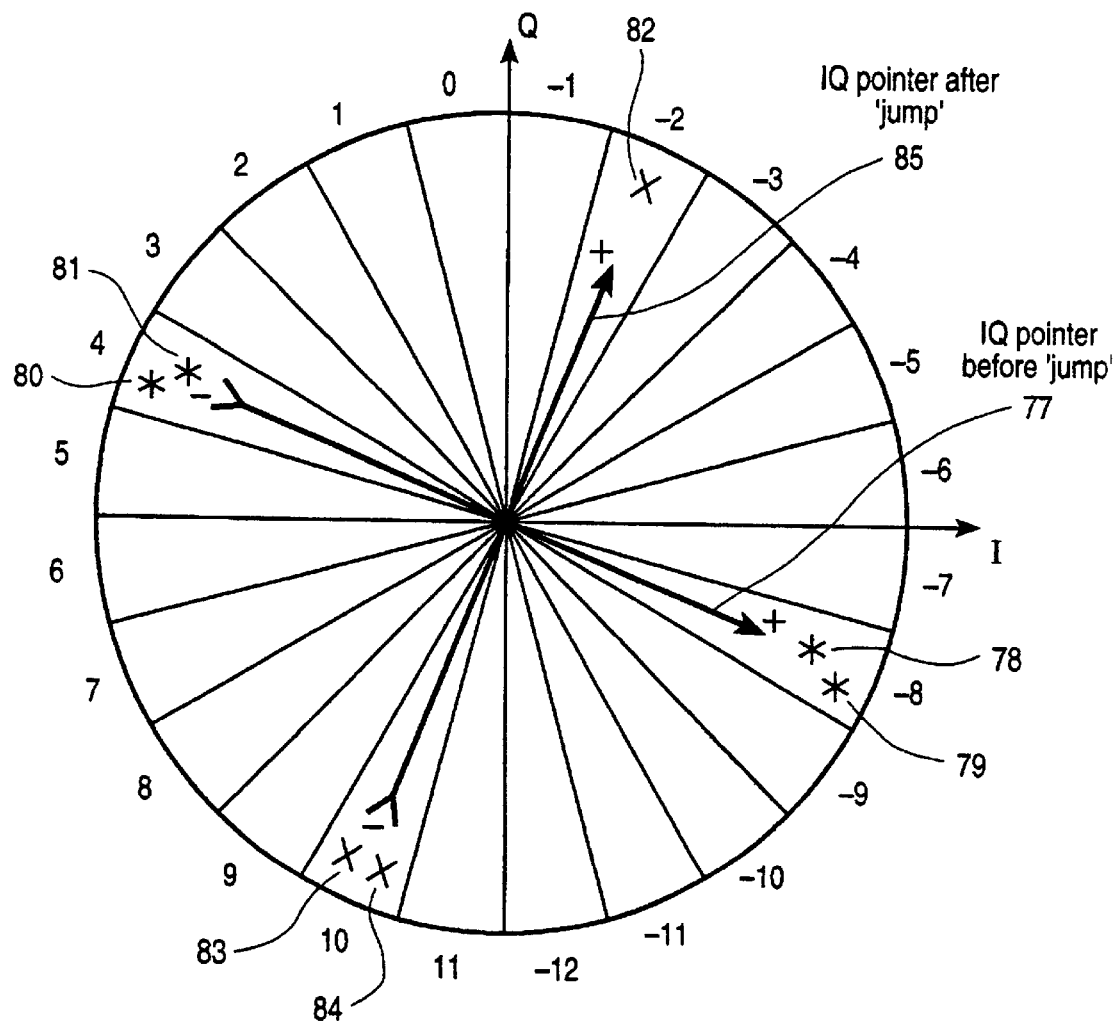
FIG. 4b is another diagram used to illustrate the IQ pointer jumping or realigning with received samples.

When the in-phase data signal I and the quadrature data signal Q are plotted on a graph (an IQ diagram), the I and Q data signals create a data line that passes through the origin of the graph as illustrated in FIG. 4a. Here an arrow representing an IQ pointer is drawn lining up with 4 X's representing received bits. The two end points of the data line represent the binary "0" and "1" data. Where 72 and 73 lining up with the head of the IQ pointer represents 1s and 74 and 75 lining up with the tail represents 0s. The data on the IQ diagram is rotated about the origin depending on how received carrier phase compares to the phases of the local oscillators in the receiver. FIG. 4b shows two cases of phase differences represented by the fact that the two groups of data bits are rotated when compared to FIG. 4a. Note in both FIGS. 4a and 4b there are 24 sectors which are used in the currently preferred embodiment whereas 16 sectors are discussed in U.S. Pat. No. 5,828,676. This is not critical to the present invention. Additionally, the specific algorithm used for determining when the IQ pointer is realigned or jumped is not necessary for an understanding of the present invention. As data is received it is assigned a sector which corresponds to a distance from the then current IQ pointer. In the BPSK receiver, the I data signal and the Q data signal are digitally sampled at the center of the bit periods. Each digitized signal is then assigned to one of 24 sectors that specifies the phase of the IQ sample. The "X's" (72, 73) in FIG. 4a illustrate a case where the data representing 1's is being received with no phase difference between the sample and the IQ pointer. The two asterisks "*s" (70, 71) in FIG. 4a illustrates bits where there is a phase difference between the sample and the 10 pointer. Note that in FIGS. 4a and 4b the 24 angular sectors are sequentially numberes from 0 to 11 and from −1 to −12 so that it is easy to determine the angular distance between angular sectors. The angular distance is the number of sectors between the sample and the closer of the head or tail of the IQ pointer (76). Thus, the *70 has an angular distance or DPH 3 whereas the *71 has a DPH 4. This distance is quantitized phase information which, as will be seen, is used in prioritizing the signal anomaly referred to as DPH.

As one would expect, the phase between the local oscillator in the receiver and the oscillator used in the transmitter drift and in even otherwise ideal conditions, the Xs shown in FIG. 4a may be grouped about a different axis.

If the movement is slow relative to a bit time, then this is caused by a slight difference in the local oscillator frequencies between the transmitter and the receiver. This is as expected even during unimpaired conditions and the IQ pointer is moved or 'tracked' a sector at a time to stay in the sectors occupied by most of the recent samples. However, noise sources on the line can cause sudden larger changes in the received phase of the samples. If there is a sudden change where the sectors occupied by several bits in a row change by several sectors, then the IQ pointer is moved or 'jumped' to re-align it with the data.

This is illustrated in FIG. 4b where the IQ pointer 77 is first with its head in sector −8 to align with the *s(78–81) and then is jumped to sector −2 (85) to align with the Xs (82–84). It is assumed here that the samples represented by the Xs occurred later in time than the samples represented by *s and further that sample 82 occurred before samples 83 and 84. Sample 82, the first bit for the re-aligned IQ pointer, is pointed to as a suspected bit in error. It is the pointer to this first bit after a jump of the IQ pointer and the delta phase pointers DPH3 (70) and DPH4 (71) of FIG. 4a which are prioritized in the present invention.

Figure 3:
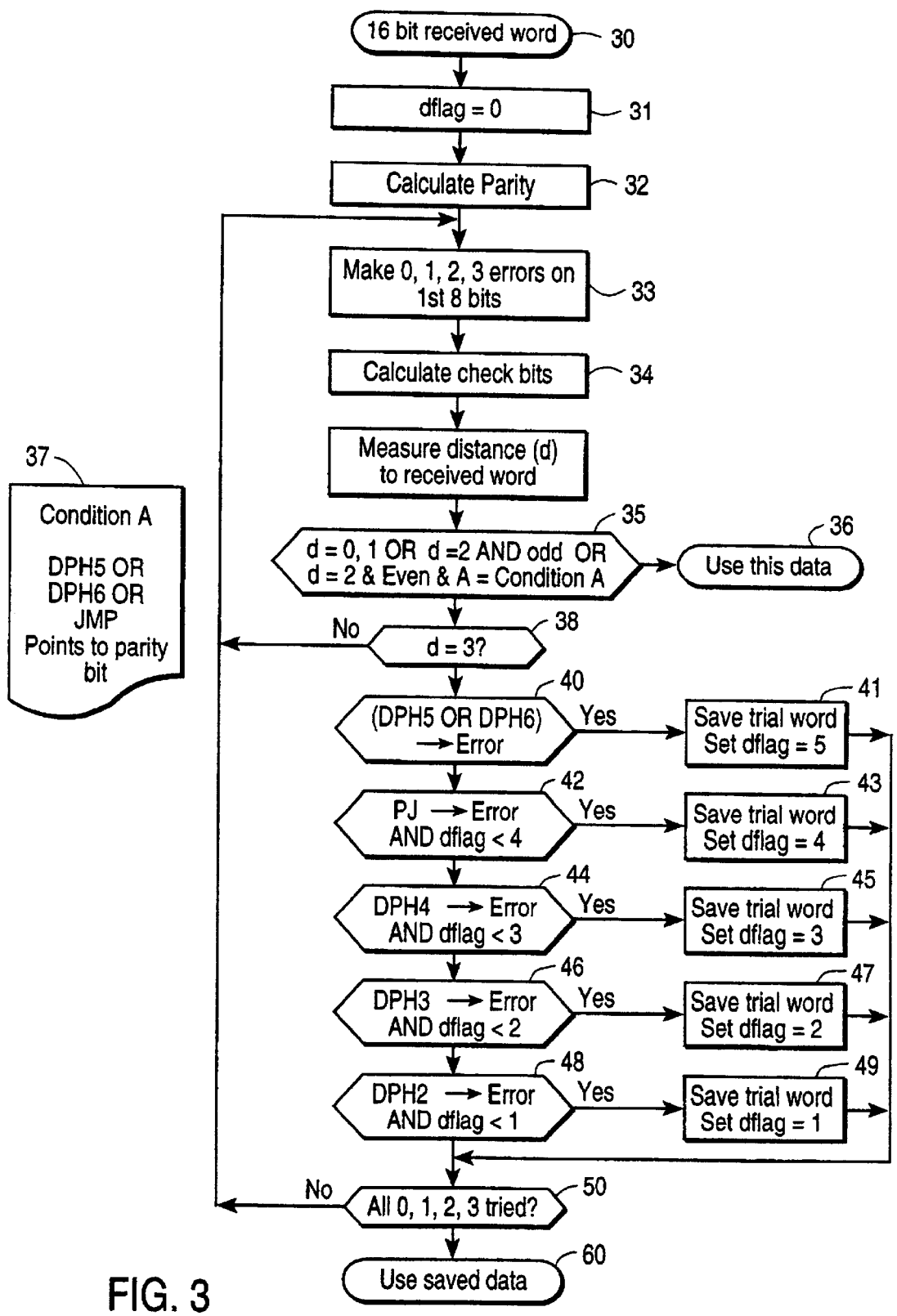
FIG. 3 is a flow diagram illustrating the steps of the present invention.

As will be seen in connection with FIG. 3, a distance in the delta phase pointer (DPH) of 5 or 6 is considered to be the highest priority signal anomaly for one embodiment. The next lower priority anomaly is the realigning of the pointer (PJ). The next three priorities of anomalies are a DPH of 4, 3 and 2, respectively.

PROCESS OF THE PRESENT INVENTION, FIG. 3

Referring now to FIG. 3, step 30 illustrates the receiving of a 16 bit word such as the received data word 13 and a parity bit. Where interleaving is used, step 30 represents the receiving of the de-interleaved words. Once a word is received a dflag (a hardware register, for instance,) is set to zero as shown by step 31. The content of this register indicates the confidence level in a correction made to data. The highest confidence level is five and the lowest is one.

Now as shown by step 32, the parity is calculated for the received data word. This is done by examining the first 15 bits of the 16 bit word. Next as shown by steps 33 and 34, the check bits are calculated based on 0, 1, 2, or 3 errors introduced into the received data bits to make the trial code word.

Following this the Hamming distance is computed. This distance is the distance between the received data word, and the trial code word. (First it is assumed that there are no errors in the data bits, thus the Hamming distance is the difference between the received and trial check bits.)

In a separate logic operation, as shown by step 37, the received signal which provided the parity bit is examined in order to determine the parity bit's reliability. As shown by step 37, condition A is satisfied if the received signal corresponding to the parity bit has a delta phase distance of 5 or 6 or if a pointer jump occurred during that bit time. If any of these signal anomalies occurred it is used as a hint to indicate that the parity bit is unreliable.

Referring now to the step 35, if the Hamming distance is zero or one the received data bits are accepted as the correct data as shown by step 36. If the Hamming distance is two and the parity bit is as it should be for two errors, (see markers 28 and 29 of FIG. 2) the data bits are accepted as shown by step 36. Finally as shown by step 35 if a Hamming distance is two and a parity bit indicates that the parity is incorrect, but that in all likelihood the parity bit is incorrect (condition A is met) then again the data bits are accepted as shown by step 36.

To this point in the method, the hint has only been used for purposes of evaluating the validity of the parity bit. As will be seen from the remaining steps of FIG. 3 the highest priority anomalies which point to bits that are different between the received data word and trial code word are used to provide pointers to suspect bits.

Step 38 shows that if the Hamming distance is three the process moves on to step 40. If the Hamming distance is not three there is a return to step 33. This will occur if the Hamming distance is two and the parity bit indicates that there are not two errors or if the Hamming distance is greater than three.

Assume first the Hamming distance is four, then there is a return to step 33. This time it is assumed there is a one bit error in the data bits and one of the data bits is changed. Then steps 34 and 35 are repeated this time, however, the Hamming distance is measured between the trial code word and the received word. Again there is a return to step 38 if the data bits are not accepted.

Steps 40 through 48 operate on the trial code word generated in steps 33 and 34. Step 40 illustrates the examining of the delta phase 5 and 6 anomalies to see if it points to one of the three bits that are different between the received word and the trial code word. (For steps 40 through 48 the differences in the first 15 bits are considered. The parity bit is not used.) If the delta phase 5 or 6 anomaly points to one of the three different bits the trial byte is saved in step 41 and the priority 5 is stored in the dflag.

In step 42 if a pointer jump anomaly points to a bit that is different and the dflag is less than 4, the trial byte is stored in step 43 and the dflag is set to priority 4. This is to prevent further pointer jump corrected bytes of lower priority from overwriting the previously saved one. In one embodiment, only a jump of 5 sectors or greater is used, anything less is not considered as a signal anomaly.

In step 44 if delta phase 4 anomaly points to a bit that is different and the dflag is less than 3, the trial byte is stored in step 45 and the dflag is set to priority 3. This is to prevent further delta phase 4 corrected bytes and lower priority corrected bytes from overwriting the previously saved one.

In step 46 if a delta phase 3 anomaly points to a bit that is different and the dflag is less than 2, the trial byte is stored in step 47 and the dflag is set to priority 2. This is to prevent further delta phase 3 corrected bytes and lower priority corrected bytes from overwriting the previously saved one.

In step 48 if a delta phase 2 anomaly points to a bit that is different and the dflag is less than 1, the trial byte is stored in step 49 and the dflag is set to priority 1. This is to prevent further delta phase 2 corrected bytes and lower priority corrected bytes from overwriting the previously saved one.

Finally, as shown by step 50, the process is repeated starting with step 33 until all possible errors of 1, 2, and 3 bits in the data byte have been tried. If no data is saved (dflag=0) the received word is discarded and the packet is discarded. If one has been saved (dflag>0) it is used as shown by step 60.

As can be seen, the last changes to the received data word that qualifies will become the final data word that it used once step 60 is reached. This is the particular algorithm selected for one embodiment. Others may be used, for instance, the process may be halted once there is a data word that qualifies without trying all of the 1, 2 and 3 errors in the received data word.

The process of FIG. 3 may be implemented in an application specific integrated circuit (ASIC) or in software.

We claim:

1. A method for sending a code word from a set of valid code words;

identifying trial bit words with errors that appear to be less than a predetermined distance from a code word;

identifying multiple signal anomalies;

prioritizing the anomalies; and finding which anomalies point to a bit that when changed decreases the distance from the received word to a code word.

2. The method defined by claim defined by claim 1 including selecting the word pointed to by the highest priority anomaly that points to a bit that when changed decreases the distance to a code word.

3. The method defined by claim 1 or 2 including correcting other errors in the received word using an error correcting code.

4. A method for correcting errors in a signal representing a received word which has received data bits and received check bits, comprising:

- detecting and prioritizing certain signal anomalies;
- determining the Hamming distance for words with one or more trial bits when the Hamming distance associated with the received bits is larger than a predetermined range; and
- determining if the trial bits have a Hamming distance of a predetermined value and a signal anomaly points to a bit that was changed to for the trial bits.

5. The method defined by claim 4 including the accepting of a trial code word when the Hamming distance is within the predetermined range.

6. The method defined by claim 4 wherein the word with the highest signal anomaly that points to a bit that was changed to form the trial bits is accepted.

7. The method defined by claim 6 including a parity bit in the signal and wherein the predetermined range is different depending upon whether the state of the parity bit supports the received word.

8. The method defined by claim 6 wherein one signal anomaly which is prioritized is the distance each bit is from a predetermined phase pointer.

9. The method defined by claim 8 wherein another signal anomaly which is prioritized is the realigning of the pointer.

10. A method for correcting errors in a received signal, comprising:

- receiving a signal representing a code word having received data bits and check bits, and a parity bit;
- determining a Hamming distance;
- accepting the data bits if the distance is within a predetermined range;
- trying different data bits than those in the received data bits if the distance is not within the predetermined range by;
  - (a) prioritizing signal anomalies
  - (b) examining the signal to determine the highest signal anomaly present based on the prioritization; and
- determining the highest signal anomaly that points to one of the bits that is different.

\* \* \* \* \*